United States Patent [19]
Clymer et al.

[11] Patent Number: 5,525,901
[45] Date of Patent: Jun. 11, 1996

[54] SENSOR SYSTEMS FOR MONITORING AND MEASURING ANGULAR POSITION IN TWO OR THREE AXES

[75] Inventors: Mark Clymer, Mystic; Glenn Graves, Oakdale, both of Conn.

[73] Assignee: Beaudreau Electric, Inc., Waterford, Conn.

[21] Appl. No.: 12,565

[22] Filed: Feb. 2, 1993

[51] Int. Cl.⁶ .............................. G01B 7/30; G01R 33/06
[52] U.S. Cl. .................. 324/207.21; 324/252; 338/32 R; 33/355 R
[58] Field of Search .......................... 324/207.2, 207.21, 324/207.23, 235, 247, 252, 259; 338/32 R; 74/471 XY; 33/356, 355 R

[56] References Cited

U.S. PATENT DOCUMENTS

| | | | |
|---|---|---|---|
| 3,727,177 | 4/1973 | Fuller et al. | 33/361 X |
| 3,881,258 | 5/1975 | Iddings | 33/361 X |
| 3,942,258 | 3/1976 | Stucki et al. | 324/247 X |
| 4,283,679 | 8/1981 | Ito et al. | 324/207.21 X |
| 4,296,377 | 10/1981 | Ohkubo | 324/252 |
| 4,462,165 | 7/1984 | Lewis | 324/247 X |
| 4,490,674 | 12/1984 | Ito | 324/252 X |
| 4,525,671 | 6/1985 | Sansom | 324/252 |
| 4,533,872 | 8/1985 | Boord et al. | 324/252 |
| 4,661,773 | 4/1987 | Kawakita et al. | 324/247 X |
| 4,849,696 | 7/1989 | Brun et al. | 324/252 |
| 4,918,824 | 4/1990 | Farrar | 33/361 |
| 4,945,305 | 7/1990 | Blood | 324/207.17 |
| 5,010,653 | 4/1991 | Fowler | 324/247 X |
| 5,041,785 | 8/1991 | Bogaerts et al. | 324/207.21 X |
| 5,046,260 | 9/1991 | Wellhausen | 33/356 |
| 5,105,548 | 4/1992 | Fowler | 33/356 |
| 5,119,025 | 6/1992 | Smith et al. | 324/252 |
| 5,170,566 | 12/1992 | Fowler et al. | 33/356 |

Primary Examiner—Sandra L. O'Shea
Assistant Examiner—J. Patidar
Attorney, Agent, or Firm—Fliesler, Dubb, Meyer & Lovejoy

[57] ABSTRACT

The present invention relates to a sensor system that uses two sensors for measuring and monitoring of angular position of a member in two or three axes. The sensor system of the present invention preferably uses a pair of magnetoresistive sesors that are maintained in the same plane and in orthogonal configuration with respect to each other, and which reference their position according to the Earth's magnetic field or a magnetic field provided by a user. Accordingly, the sensors of the present invention are useful for a variety of purposes, including, virtually any application that requires monitoring and measurement of any combination of roll, pitch, and yaw.

10 Claims, 10 Drawing Sheets

SENSOR SYSTEMS FOR MONITORING AND MEASURING ANGULAR POSITION IN TWO OR THREE AXES

BACKGROUND OF THE INVENTION

1. Field of the Invention

The present invention relates to a sensor system that allows measuring and monitoring of angular position in two or three axes. The sensor system of the present invention references its position according to the Earth's magnetic field or a magnetic field provided by the user. Accordingly, the sensors of the present invention are useful for a variety of purposes, including, virtually any application that requires monitoring and measurement of any combination of roll, pitch, and yaw.

2. Description of the Prior Art

There are a variety of sensors known in the art for use in measuring magnetic fields, such as Hall effect sensors, proton quantum interference detectors (SQUID), fluxgate magnetometers, inductive pickup sensors, magnetoresistive sensors, and others. Depending upon the application, one or another of the above sensors may be chosen for a particular magnetic field measurement.

Magnetic field sensors provide a highly effective means of measuring both linear and angular displacement. This is because even quite small movements of actuating components in machinery, for example, metal rods, gears, cams, etc., can create measurable changes in magnetic field.

The art was previously dominated by Hall effect sensors that make use of the property of a current-carrying semiconductor membrane (Hall element) of generating a low voltage perpendicular to the direction of current flow when subjected to a magnetic field normal to its surface. More recently, magnetoresistive sensors have proven to be very versatile as replacements for Hall effect sensors in magnetic field measurement.

Magnetoresistive sensors make use of a magnetoresistive effect which is a property of a current-carrying magnetic material to change its resistivity in the presence of an external magnetic field. This change is brought about by rotation of the magnetization relative to the current direction. A typical magnetoresistive sensor comprises a polarized element within a flux collector that exhibits a change in resistance in the presence of a magnetic flux. The polarized element may be linear or it may be arranged in geometric patterns, such as meandering the element through the flux collector. Through arranging the element nonlinearly within the flux collector, one is able to increase the length of the element while maintaining a small size of the overall sensor. Further, the resistance of the element increases as length increases and since the sensor operates by changes in resistance in the element, overall sensitivity of the sensor is enhanced. An overview of many of the attributes and functions of magnetoresistive sensors are found in "The Magnetoresistive Sensor" Technical Publication No. 268, a product brochure of Philips Components.

In many applications, it has been believed that in order to measure angular positioning in three axes it is necessary to utilize at least three sensors to provide three outputs which may be compared to determine the change in angular positioning. It will be also appreciated that electronic compasses, for example, have been developed with just one or two sensors. However, compasses only need to measure in a single axis.

Prior art sensor systems which have been developed for use in monitoring in three axes have required somewhat complex electronics and have also been of high price. Thus, a need remains in the sensor art for a sensor system that may measure angular positioning in three axes without being burdened by complexity.

SUMMARY OF THE INVENTION

The present invention is related to a sensor system that is useful for determining angular position of an item to which it is attached. For example, the sensor system of the present invention may be attached to a helmet and used to monitor the direction that the wearer turns his or her head or looks up or down or tilts from side to side. As such, the sensor system is very useful for interactive video games or in flight simulators and the like.

Generally, the sensor system of the present invention has a first sensor that can determine position in a first axis of a magnetic field and a second sensor that can determine position in a second axis of a magnetic field. Preferably, the sensors are magnetoresistive sensors. Between the two sensors, there is an intervening source of a magnetic field, such as a magnet. Power is applied to each of the sensors and a current is output that will vary depending on how the sensors are turned in an external magnetic field, such as the Earth's magnetic field. The output from the sensors are interconnected with amplifiers that allow the first sensor to only see right and left turning (rotation) and the second sensor to see only up and down motion (tilt). Or, by changing the amplifiers, the first sensor can see side-to-side motion (yaw), but not right and left.

However, by interconnecting an additional amplifier to the first sensor, it becomes possible to have that sensor see both rotation and yaw. Thus, sensing in three axes becomes possible with just two sensors.

Also, the sensor system can be used as an alternative to a mouse on a computer or as a controller of a vehicle, such as an electric wheelchair, by keeping the sensors still and moving a mounted magnet around the sensors. The first sensor sees the movement of the magnet in one direction (an X axis) and the second sensor sees the movement of the magnet in another direction (a Y axis).

In accordance with a first aspect of the present invention there is provided a sensor system for measurement of angular position in at least two axes, comprising a first magnetoresistive sensor, a second magnetoresistive sensor located in a common plane with the first sensor and separated from the first sensor by a biasing magnetic field, the first and second sensors being orthogonal to one another and each of the sensors being adapted to vary in resistance in accordance with the angular position of the sensors in an external magnetic field. The sensors have input terminals for applying a voltage thereto and output terminals. In a preferred embodiment, a first amplifier circuit of a first gain is connected to the output terminal of the first sensor so as to receive an output voltage from the output terminal of the first sensor and to produce a first amplified voltage in response thereto, and a second amplifier circuit of a second gain connected to the output terminal of the second sensor so as to receive an output voltage from the output terminal of the second sensor and to produce a second amplified voltage in response thereto. These first and second amplified voltages define a measurement of an angular position of the first and second sensors in relation to the external magnetic field.

In a preferred embodiment, the biasing magnetic field is a permanent magnet. In another preferred embodiment, the first gain is sufficiently high to ensure that an amplified voltage from the first amplifier will vary according to a magnetic flux of the external magnetic field horizontal to the plane of the sensors, while an amplified voltage from the second amplifier will vary according to a magnetic flux of the external magnetic field perpendicular to the plane of the sensors. In another preferred embodiment, the first gain is sufficiently low such that an amplified voltage from the first amplifier will vary according to a magnetic flux of the external magnetic field perpendicular to the plane of the sensors, while an amplified voltage from the second amplifier will vary according to a magnetic flux of the external magnetic field perpendicular to the plane of the sensors. In another preferred embodiment, the sensor system further comprises a first analog to digital converter connected to the first amplifier circuit so as to receive the first amplified voltage therefrom and produce a digital signal representation of the first amplified voltage, and a second analog to digital converter connected to the second amplifier circuit so as to receive the second amplified voltage therefrom and produce a digital signal representation of the second amplified voltage.

The sensor system so constructed preferably provides a first amplified voltage that is representative of an amount of roll experienced by the sensor system with respect to an initial sensor position, and the second amplified voltage is representative of an amount of tilt experienced by the sensor system with respect to an initial sensor position. In the alternative, the first amplified voltage is representative of an amount of yaw experienced by the sensor system with respect to an initial sensor position, and the second amplified voltage is representative of an amount of tilt experienced by the sensor system with respect to an initial sensor position.

In another preferred embodiment, the sensor system may be used for measurement of angular position in at least two axes, and, preferably three axes. In such embodiment, a third amplifier circuit of a third gain connected to the output terminal of the second sensor so as to receive an output voltage from the output terminal of the second sensor and to produce a third amplified voltage in response thereto. In such embodiment, the first, second, and third amplified voltages define a measurement of an angular position of the first and second sensors with respect to at least two axes and in relation to the external magnetic field. In a preferred embodiment, the first gain is sufficiently high to ensure an amplified voltage from the first amplifier circuit will vary according to a magnetic flux of the external magnetic field horizontal to the plane of the sensors, while an amplified voltage from the second amplifier circuit will vary according to a magnetic flux of the external magnetic field perpendicular to the plane of the sensors and an amplified voltage from the third amplifier circuit will vary according to a magnetic flux of the external magnetic field perpendicular to the plane of the sensors. Moreover, such embodiment preferably comprises a third analog to digital converter connected to the third amplifier circuit so as to receive the third amplified voltage therefrom and produce a digital signal representative of the third amplified voltage.

In accordance with another aspect of the present invention, there is provided a method for measuring angular displacement or position of a member in two axes by use of a first magnetoresistive sensor and a second magnetoresistive sensor located in a common plane, and separated from one another by a biasing magnetic field, the first and second sensors being orthogonal to one another and each of the sensors being adapted to vary in resistance in accordance with the angular position of the sensors in an external magnetic field, the sensors having respective input terminals for applying a voltage thereto and respective output terminals, the method comprising the steps of attaching the sensors to the member in an orientation such that the plane defined by the sensors is initially generally aligned parallel to a horizontal component of the external magnetic field, supplying a voltage to each of the sensors such that an output voltage is produced by each of the sensors, amplifying the output voltage from the first sensor with a first gain to produce a first amplified output voltage, amplifying the output voltage from the second sensor with a second gain to produce a second amplified output voltage, angularly displacing the member in at least one axis to cause a change in the output voltage from at least one of the sensors, wherein a change in one of the first and second amplified output voltages provides a measurement of a change in angular position of the member.

In a preferred embodiment, the method further comprises the step of setting the first gain sufficiently high so that the output voltage from the first sensor corresponds to angular displacement of the first sensor relative to a horizontal component of the external magnetic field, such that monitoring and measuring is accomplished in the X and Y axes. In another preferred embodiment, the method further comprises the step of setting the first gain sufficiently low so that the output voltage from the first sensor corresponds to angular displacement of the first sensor relative to a vertical component of the external magnetic field, such that monitoring and measuring is accomplished in the Y and Z axes. In yet another preferred embodiment, the method further comprises the steps of providing a processor and associated software and hardware, and communicating the first and second amplified voltages to the processor so as to produce signals from the processor for controlling a function within the hardware or software. In another preferred embodiment, the method further comprises the step of interfacing a display with the processor, such that the signals from the processor control an operation on the display in response to angular displacement of the member. In another preferred embodiment of the method the step of controlling an operation on the display comprises controlling a cursor position. Alternatively, the step of controlling an operation on the display comprises controlling an image selection on the display. In such embodiment, preferably, the image selection on the display is a view of the surroundings of the member, such that as the member is rotated in a right or a left direction or is tilted in an up or down direction, the view presented on the display is shifted in corresponding direction. In highly preferred embodiments, the member is preferably selected from the group consisting of a hand, a finger, a chest, and a head.

The method may also be practiced so as to measure angular displacement or position of a member in three axes. In such embodiment, one amplifies the output voltage from the first sensor with a first gain to produce a first amplified output voltage, amplifies the output voltage from the first sensor with a second gain to produce a second amplified output voltage, and amplifies the output voltage from the second sensor with a third gain to produce a third amplified output voltage. When the member is angularly displaced, in at least one axis to cause a change in the output voltage from at least one of the sensors, a change in one of the first, second, and third amplified output voltages provides a measurement of a change in angular position of the member.

In accordance with another aspect of the present invention, there is provided a method for controlling movement of a device in two axes in response to movement of a mechanically separated member, using the preferred sensor system of the present invention and orienting the sensors in a selected configuration with respect to a movable magnetic field, supplying a voltage to each of the sensors such that output voltage is produced by each of the sensors, amplifying the output voltage from the first sensor with a first gain to produce a first amplified output voltage, amplifying the output voltage from the second sensor with a second gain to produce a second amplified output voltage, moving the movable magnetic field in at least one axis, so as to thereby cause a change in the output voltage from at least one of the sensors, wherein a change in the first amplified output voltage corresponds to the movement of the movable magnetic field in an X axis, and a change in the second amplified output voltage corresponds to the movement of the movable magnetic field in the Y axis, providing means for controlling the device in response to changes in the first and second amplified output voltages. In a preferred embodiment, the device comprises a machine with an electric motor, steering means, and the means for controlling comprises an interface means electrically connecting the sensor system and the electric motor and steering means, the method further comprising the steps of controlling direction and speed of the motor in response to a change in the first amplified output voltage, and controlling steering in response to a change in the second amplified output voltage. In another preferred embodiment, the device is a computer and the means for controlling further comprise an interface means between the sensor system and the computer, the method further comprising the steps of controlling an X coordinate on the screen in response to a change in the first amplified output voltage, and controlling a Y coordinate on the screen in response to a change in the second amplified output voltage.

In accordance with yet another aspect of the present invention, there is provided a cursor positioning device for a computer having a display, that comprises a housing, an external magnetic field generating device movably secured in proximity to the housing, the generating device being accessible to a user and freely movable in two axes, a pair of sensors mounted on the housing in proximity to the movable magnetic field oriented such that when the movable magnetic field is moved in one or two axes, an output voltage is produced from each of the sensors of the sensor system, one the output voltage corresponding to the movement of the movable magnetic field in an X axis, and the other the output voltage corresponding to the movement of the movable magnetic field in the Y axis, and means responsive to the output voltages for controlling the cursor of the computer so as to move the cursor on the display in directions and distance representative of the movement of the magnetic field about the corresponding X and Y axes. In a preferred embodiment, the external magnetic field generating device comprises a permanent magnet. In another preferred embodiment, the external magnetic field generating device is movably secured to the housing through use of a slidable mount. In another preferred embodiment, the external magnetic field generating device is movably secured to the housing through use of a flexible membrane.

Advantageously, the device further comprises an electrical contact on a distal end of the external magnetic field generating device, a contact plate interposed between the pair of sensors and the external magnetic field generating device with a distance therebetween sufficient that the electrical contact and the contact plate will generally not be in contact, means connected to the external magnetic field generating device for allowing the external magnetic field generating device to be depressed to allow the electrical contact to come into contact with the contact plate. In a preferred embodiment, the device further comprises means responsive to contact between the electrical contact and the contact plate to control a function of the computer.

In accordance with another aspect of the present invention, there is provided a sensor system for measuring angular position, comprising a first magnetoresistive sensor for providing a first signal representative of position of the first sensor with reference to a first axis, a second magnetoresistive sensor oriented with respect to the first sensor for providing a second signal representative of position of the second sensor with reference to a second axis, means responsive to the first and second signals for indicating the angular position of the sensors with respect to the first and second axes. In a preferred embodiment, the sensor system additionally comprising means responsive to the first signal for providing a third signal representative of position of the first sensor with reference to a third axis, and wherein the means responsive to the first and second signals further comprises means responsive to the third signal for indicating position with respect to the first, second, and third axes.

Further details and understanding of the foregoing will be available through reference to the following detailed description and with reference to the drawings.

DETAILED DESCRIPTION OF THE PREFERRED EMBODIMENTS

In accordance with the present invention, there is provided a novel sensor system which enables the monitoring and measuring of angular positioning in two or three axes.

In a preferred embodiment, this is accomplished through deploying two magnetoresistive sensors orthogonally or perpendicular to one another in the same plane, and monitoring the change in resistance flux due to the Earth's magnetic field as it acts upon these sensor systems or due to another external magnetic field.

I. The Sensor Systems of the Present Invention

Figure 1:
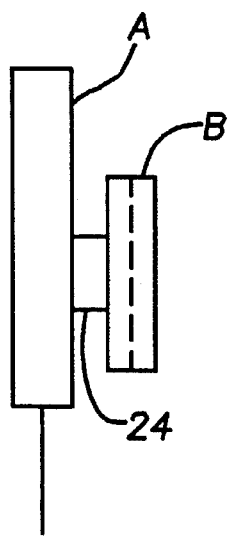
FIG. 1 is a side elevational view of one preferred sensor arrangement in accordance with the present invention, showing two orthogonally positioned magnetoresistive sensors with a biasing magnet located therebetween.
Figure 2:
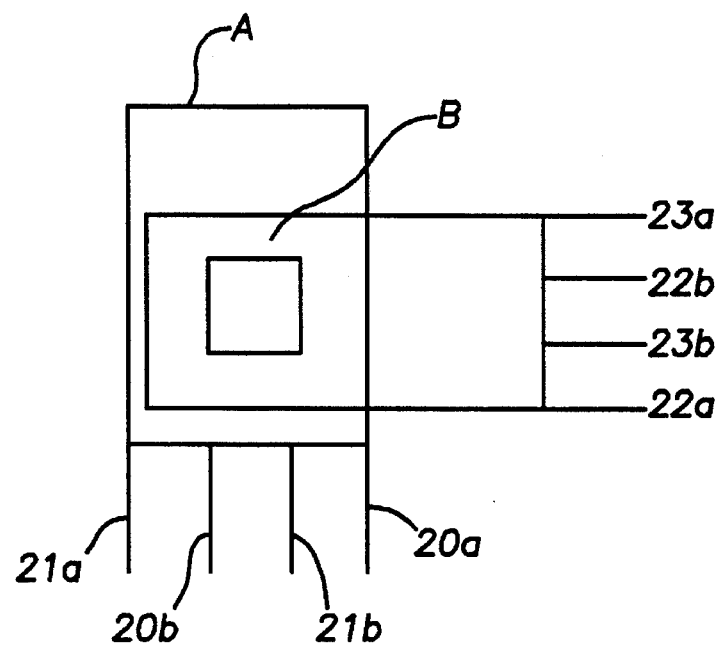
FIG. 2 is a top elevational view of the preferred sensor arrangement of FIG. 1.
Figure 3:
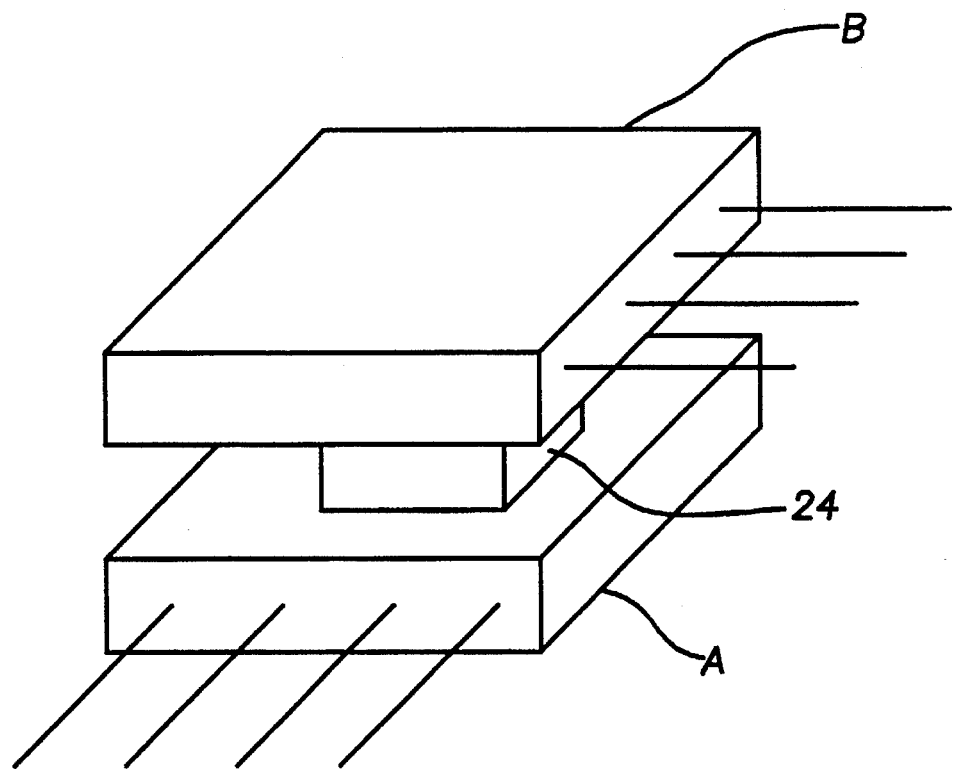
FIG. 3 is a top perspective view of the preferred sensor arrangement of FIG. 1.

Referring now to FIGS. 1 and 2, there is provided a side elevational view of the preferred sensor arrangement in accordance with the present invention, showing two orthogonally positioned magnetoresistive sensors with a biasing magnet located therebetween, and a top elevational view of the preferred sensor arrangement of FIG. 1., respectively. Also, in FIG. 3, there is provided a top perspective view of the preferred sensor arrangement of FIG. 1. In each of these Figures, it will be appreciated that sensors A and B are deployed in the same plane at a 90° angle to one another. While the 90° angle is critical to the present invention, it is only critical in that it provides the least complex circuit requirement for generating angular positions. One could easily offset the sensors by less than or more than 90°. However, the 90° angle optimizes the sensitivity of the sensor system. Sensor B is used only for the measurement of tilt and as one moves the angle from 90° in relation to sensor A, toward either 0° in relation to sensor A or toward 180° in relation from sensor A, less and less of the flux corresponding to tilt is measurable. It will also be understood that a single sensor could be designed to accomplish the objectives of the present invention.

In the preferred embodiment, each of sensors A and B are magnetoresistive sensors. Sensor A has an input from a 5 volt DC power supply 20a, a ground 20b and signed outputs 21a (negative) and 21b (positive). Similarly, in the preferred embodiment, sensor B is identical, with its power supply input 22a (also 5 volt DC), ground 22b and signed outputs 23a (negative) and 23b (positive). The power supply inputs 20a and 22a, respectively, provide electric current at the indicated DC voltage into the sensor. Within each sensor, there is a resistive element (not pictured) that when subjected to a magnetic flux, changes in resistance, thus varying the output voltage that will be present on output leads 21a, 21b, 23a, and 23b.

In a preferred embodiment, the sensors are conventional magnetoresistive sensors, such as the KMZ10 series of sensors, particularly, the KMZ10A sensors (available from Philips Components, Riviera Beach, Fla.). In such sensors, the internal resistive element is manufactured from Permalloy (a ferromagnetic Fe-Sn alloy containing 20% iron and 80% tin). Four such elements are arranged in a meander pattern and connected to form the four arms of a Wheatstone bridge. The degree of bridge imbalance or the variation in the magnetic field in the plane of the elements normal to the direction of the current is used to indicate the magnetic field strength. The KMZ10 series of sensors also contain aluminum strips deposited on the elements at 45° to their axes to ensure the linear characteristics of the bridge. Thus, the current carrying ferromagnetic elements within the sensors will change their resistivity in the presence of a magnetic field, depending upon the strength and direction of the field.

In a preferred embodiment, situated between sensors A and B is a permanent magnet 24. The magnet 24 acts to prevent the sensors from changing polarity when subjected to random electromagnetic fluxes. In a preferred embodiment, the magnet 24 is a 1.1 to 1.4 KGauss magnet that measures 2.54 mm square. However, the size and Gauss of the magnet 24 are not critical. The positioning of the magnet 24, however, is important. In a preferred embodiment, the magnet 24 is placed on sensor A and power is supplied to it through input lead 20a and the output voltage of the sensor is measured through outputs 21a and 21b while the magnet 24 is moved to achieve the proper offset. A slight positive offset is preferred. Next, the sensor is subjected to a strong external magnetic field to induce a shift in polarity in the sensor and the offset is again measured. If it is different, the foregoing steps are repeated until the offset is the same and then the magnet 24 is affixed to sensor A. Preferably, the magnet 24 is permanently glued to the sensor.

Thereafter, the same steps are performed with sensor B until the same offset is achieved in each polarity and then sensor B is affixed to the magnet attached to sensor A. In this manner, the proper offset in each sensor is achieved, as well as stable maintenance of polarity for each sensor.

In another preferred embodiment, sensor A and sensor B lie back to back, separated by the magnet 24. The magnet 24, while tending to reduce the sensitivity of the sensors A and B slightly, the effect of this has been found to be relatively insignificant. Moreover, the use of a permanent magnet greatly simplifies the circuit needed to operate the sensor system of the present invention.

As will be understood, the magnet 24 could be replaced or substituted with another stabilizing magnetic field parallel to the internal aligning field, such as an auxiliary magnet whose field is being monitored or with a biasing coil. It will be appreciated that the use of a coil is often preferred for providing the biasing magnetic field. However, it creates the need for additional circuitry. Moreover, intermittent coils are also contemplated. Again, however, additional circuitry is required for processing the signals from the sensors, such as a synchronous rectifier, to remove the alternating current on the direct current signal from the sensor signal.

It will also be appreciated that the sensors presently intended for use in the present invention are quite small. For example, the KMZ10A sensors measure 1.8 mm in height, 4.8 mm in width, and are 17.9 mm in length, including the leads, and the magnet 24 is 2.54 mm. This permits the actual sensor configuration to be packaged in a 2 cm by 2 cm by 0.75 cm housing. Suitable housings are preferably made of plastic or other water tight solid packaging material that will not interfere with the operation of the sensors.

In a preferred embodiment, sensor A is used to measure the x coordinate of the sensor system (i.e., compass heading), while sensor B is used to measure the y and/or z coordinate(s) of the sensor system (i.e., tilt and/or yaw). The manner in which this is accomplished is seen in FIGS. 4 through 9.

Figure 4:
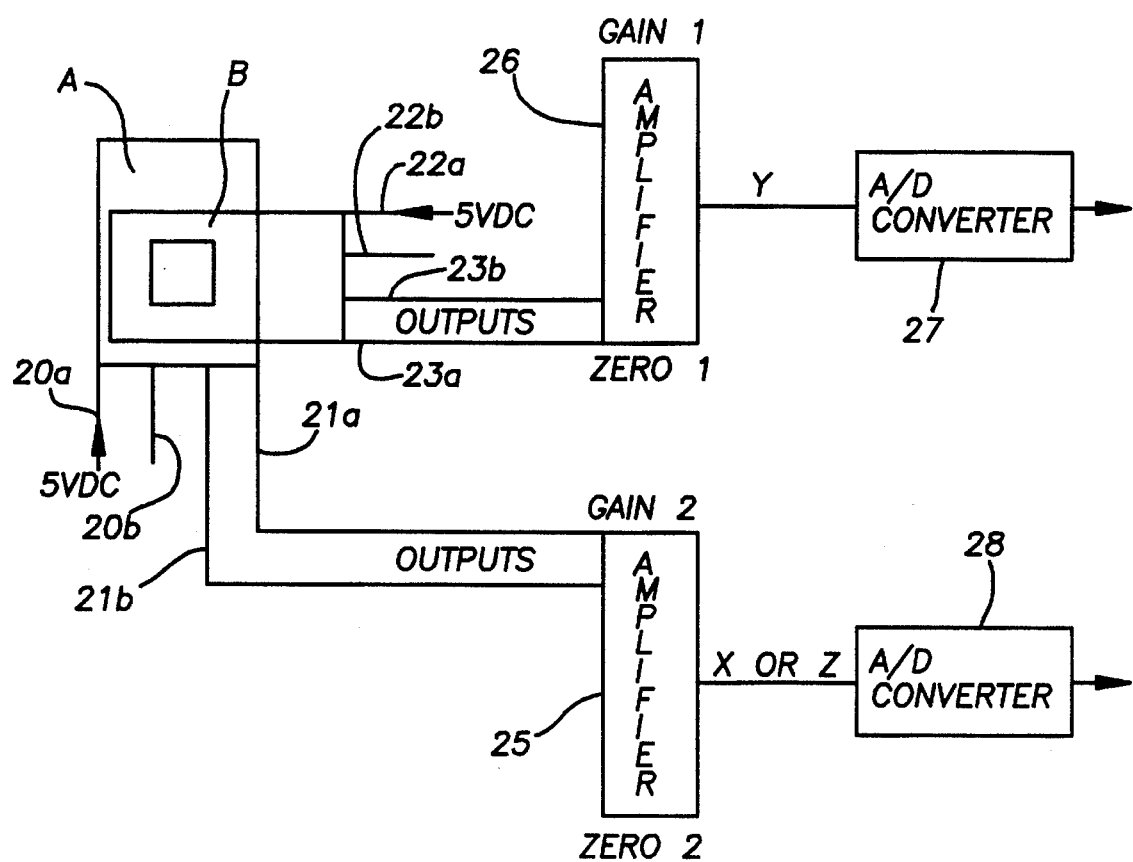
FIG. 4 is a block diagram of a preferred embodiment of the present invention for measuring in two axes.

Referring now to FIG. 4, a schematic circuit diagram of a preferred embodiment is illustrated that allows for the isolation of the x and y coordinates from sensor A and sensor B, respectively. In FIG. 4, it will be seen that voltage is applied to sensors A and B via inputs 20A and 22a respectively. A voltage will appear on output leads 21A and 21B of sensor A and 23A and 23B of sensor B, whose level will depend upon the internal resistance in sensors A and B at the given moment. Such voltage signals are communicated to operational amplifier circuits 25 (sensor A) and 26 (sensor B), wherein each of the operational amplifier circuits provide a gain of a different amplitude (as designated by gain 1 and gain 2) and of different zero (as designated by zero 1 and zero 2).

The appropriate gains are set for operational amplifier circuits 25 and 26 according to the strength of the external magnetic field's horizontal and vertical components. This is accomplished by measuring the output voltage of sensor A in the plane of the horizontal component and tilting the sensor on its side perpendicular to the plane and measuring the output voltage. The output voltage while the sensor is flat is divided by the output voltage when perpendicular to yield the differential in gain necessary to block the other component. In the continental U.S., we find that the differential is generally 4:1. It will be understood that the strength of the horizontal component of the Earth's magnetic field varies according to latitude. Thus, it is expected that gains will need to be adjusted according to the latitude of the user.

In general, then, sensor A is given a gain of 4 while sensor B is given a gain of 1. Adjustable gain operational amplifiers are preferably used to provide the gain adjustment such as TLC27L2 or TLC27L4BC. As well, the zero function that is provided in the operational amplifier circuits of a preferred embodiment merely to allow the setting of a point of reference of the offset voltage. This allows a user to provide a self centering of a cursor, for example, interfaced with the circuit and sensors.

The resulting amplified signals from the operation amplifier circuits are then optimally communicated to analog to digital converters 27 (sensor B) and 28 (sensor A) for conversion to a signal that can be readily used for monitoring, measurement, or interactive control applications.

In one aspect of the present invention, a critical factor for the circuit of the present invention is the use of differing gains in the operational amplifier circuits 25 and 26. Preferably, the gain differential should be on the order of 4:1, such that the signal communicated from sensor B is given a relatively lower gain than the signal from sensor A. This is necessary in order to minimize the signal attributable to compass (or the x coordinate) that would be derived from sensor B. However, when side-to-side tilt of the sensor system (or yaw) is sought to be measured, the gains provided by the amplification circuits may be identical.

It will be understood that the vertical component of the Earth's magnetic field is significantly stronger than the horizontal component. The horizontal component is responsible for the measurement of compass (or the x coordinate), while the vertical component is responsible for the measurement of tilt and yaw (the y and z components, respectively). Because it is weaker, the horizontal component is barely detectable unless subjected to significant amplification. Thus, through use of low gain amplification on sensor B, we observe little effect on the signal, and see basically only tilt from sensor B. While, on the other hand, sensor A is subjected to greater amplification and virtually only the compass heading (or the x component) is observed. On the other hand, if sensors A and B are given the same amplification gain (i.e., if gain 2 of operational amplifier circuit 25 is adjusted down to be equal to gain 1 of operational amplifier circuit 26), sensor A performs extremely efficiently in measuring yaw (or the z component).

Figure 5:
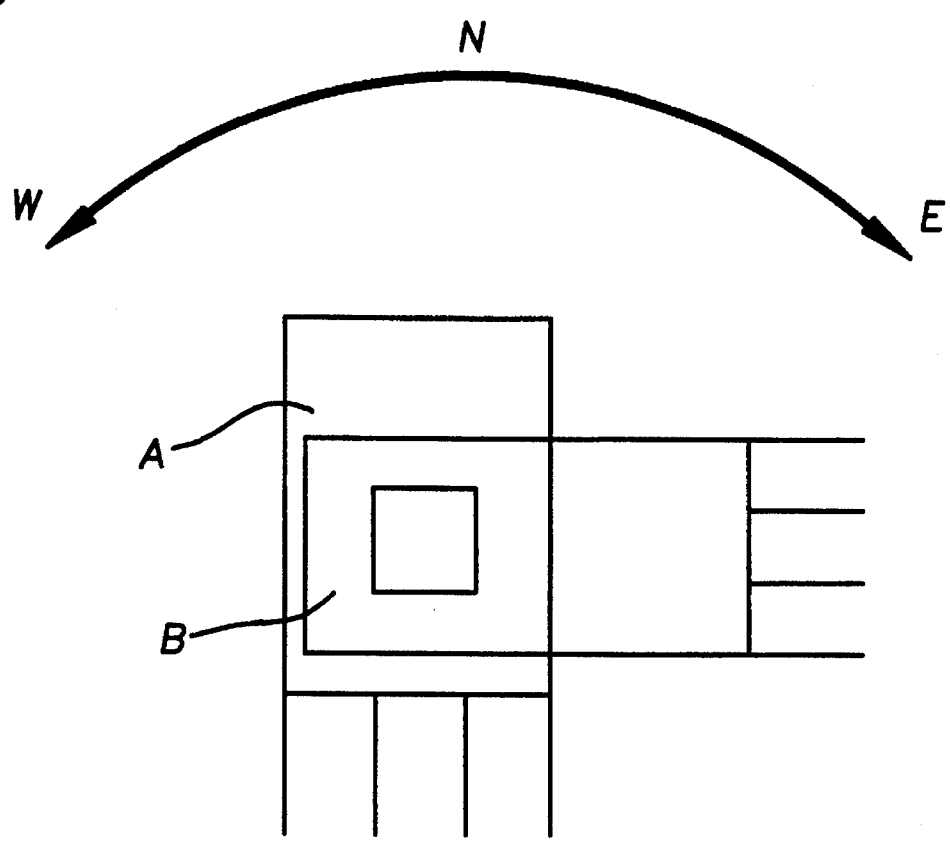
FIG. 5 is a top elevational view of the preferred sensor arrangement of FIG. 1 shown rotating in plane for determining compass direction.
Figure 6:
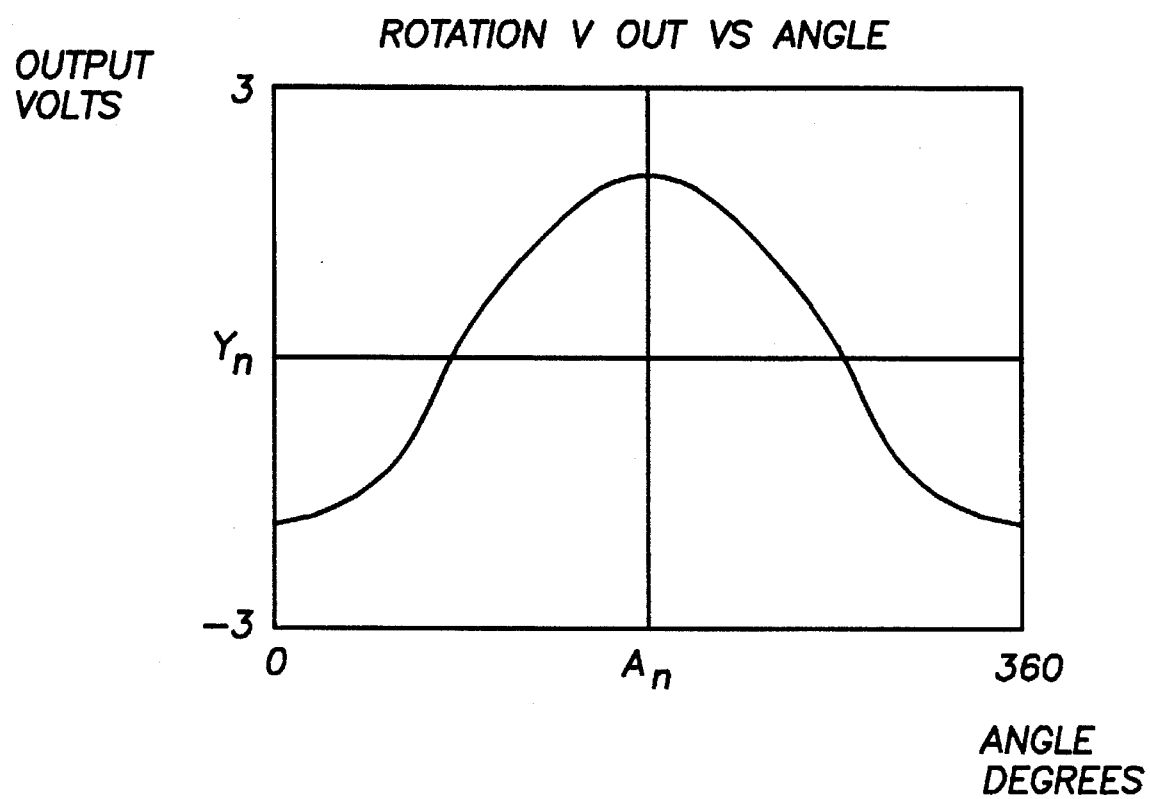
FIG. 6 is a plot showing output voltage from the sensor of FIG. 5 against its angular position in plane as rotated from magnetic north through 360° of revolution.

In operation as a roll/tilt sensor system, referring now to FIG. 5, there is pictured a schematic diagram of the sensor system of the present invention as it is rotated on plane in the x coordinate, shown specifically facing magnetic North. Here, it will be understood that compass heading due to the horizontal component of the Earth's magnetic field is being monitored by sensor A. With respect to sensor B, because of the low gain provided its signal, any compass or x component that would be sensed by sensor B is virtually invisible in such rotation. FIG. 6 shows a typical plot of the output voltage versus the angular orientation of the sensor relative to magnetic North (0°) through 360° of rotation. The plot was derived from the data presented in Table 1:

TABLE 1

| Angle (°) | Output (V) |
|---|---|
| 0 | −1.95 |
| 22.5 | −1.83 |
| 45 | −1.47 |
| 67.5 | −0.78 |
| 90 | 0.118 |
| 112.5 | 0.83 |
| 135 | 1.40 |
| 157.5 | 1.85 |
| 180 | 1.92 |
| 202.5 | 1.89 |
| 225 | 1.57 |
| 247.5 | 0.99 |
| 270 | 0.30 |
| 292.5 | −0.40 |
| 315 | −1.12 |
| 337.5 | −1.64 |
| 360 | −1.95 |

Figure 7:
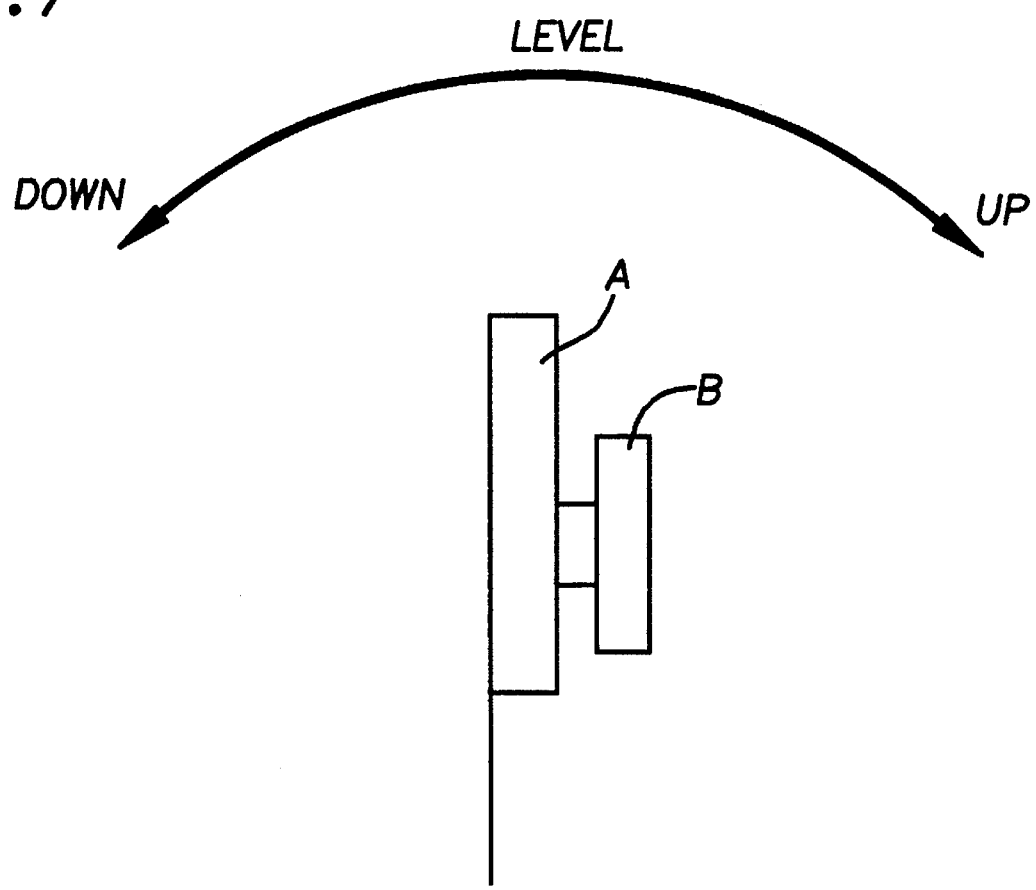
FIG. 7 is a side elevational view of the preferred sensor arrangement of FIG. 1 shown rotating in plane for determining tilt.
Figure 8:
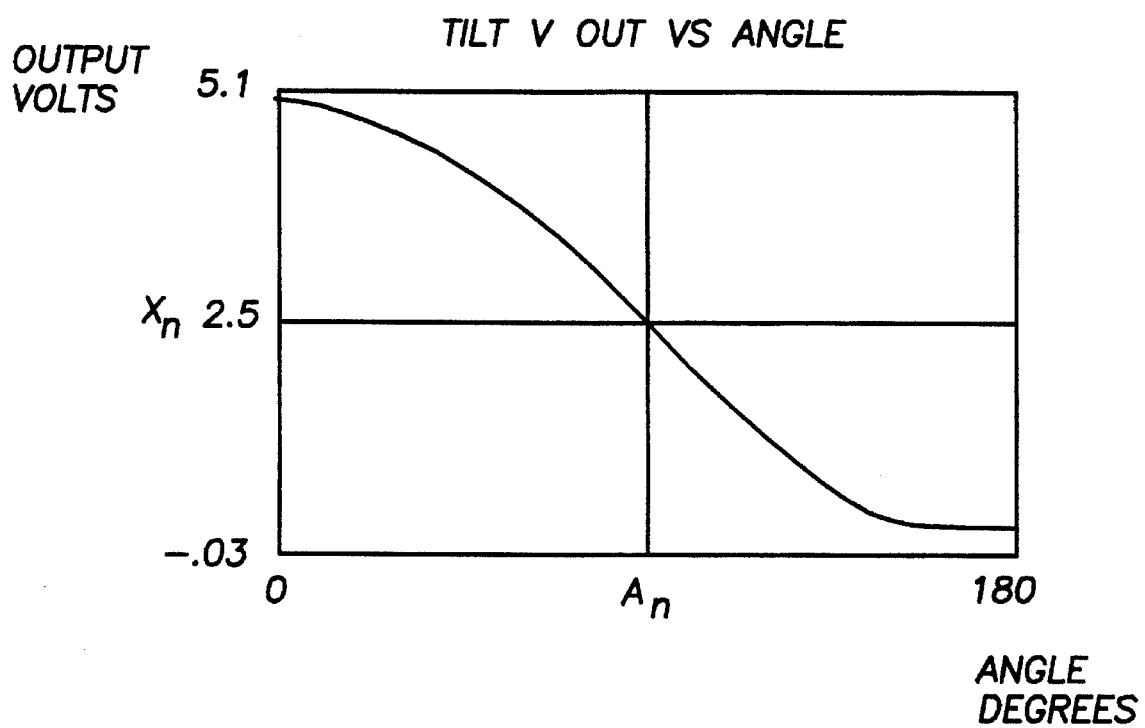
FIG. 8 is a plot showing output voltage from the sensor of FIG. 7 against its angular position in plane as rotated from zero tilt through 180° of tilt.

In FIG. 7, there is provided a schematic diagram of the sensor system of the present invention as it is tilted in plane in the y coordinate. Here, it will be understood that tilt in relation to the vertical component of the Earth's magnetic field is being monitored principally by the response in sensor B as it interacts with the vertical component of the Earth's magnetic field. It will be understood that the vertical component of the Earth's magnetic field does not affect the flux on sensor A. Sensor A, because of its orientation, is principally sensitive to the horizontal component of the Earth's magnetic field. Thus, no change in resistance in sensor A is observed when the sensor system is tilted up or down. Accordingly, in tilt, output voltage will only change from sensor B. FIG. 8 shows a typical plot of the output voltage versus the angular orientation of the sensor relative to a flat (0°) through 180° of tilt. The plot was derived from the data presented in Table 2:

TABLE 2

| Angle (°) | Output (V) |
|---|---|
| 0 | 5.01 |
| 10 | 4.97 |
| 20 | 4.86 |
| 30 | 4.68 |
| 40 | 4.43 |
| 50 | 4.14 |
| 60 | 3.75 |
| 70 | 3.36 |
| 80 | 2.94 |
| 90 | 2.50 |
| 100 | 2.05 |
| 110 | 1.62 |
| 120 | 1.27 |
| 130 | 0.925 |
| 140 | 0.605 |
| 150 | 0.362 |
| 160 | 0.168 |
| 170 | 0.081 |
| 180 | 0.075 |

In Table 3, there is provided a typical data stream generated by the sensor system of the present invention in rotation and tilt.

TABLE 3

| Sensor A ROTATION | | Sensor B TILT | |
|---|---|---|---|
| ANGLE (°) | OUTPUT (V) | ANGLE (°) | OUTPUT (V) |
| 0 | 5.08 | 0 | 5.01 |
| 10 | 4.96 | 10 | 4.97 |
| 20 | 4.80 | 20 | 4.86 |
| 30 | 4.59 | 30 | 4.68 |
| 40 | 4.23 | 40 | 4.43 |
| 50 | 3.80 | 50 | 4.14 |
| 60 | 3.45 | 60 | 3.75 |
| 70 | 3.01 | 70 | 3.36 |
| 80 | 2.51 | 80 | 2.94 |
| 90 | 2.13 | 90 | 2.503 |
| 100 | 1.71 | 100 | 2.05 |
| 110 | 1.29 | 110 | 1.62 |
| 120 | 0.95 | 120 | 1.27 |
| 130 | 0.695 | 130 | 0.925 |
| 140 | 0.395 | 140 | 0.605 |
| 150 | 0.235 | 150 | 0.362 |
| 160 | 0.065 | 160 | 0.168 |
| 170 | −0.25 | 170 | 0.081 |
| 180 | −0.01 | 180 | 0.075 |

It will be appreciated that through such refined knowledge of the output voltages generated in rotation and tilt a very accurate determination of the orientation and attitude of the sensor system of the present invention in space is enabled. For example, the sensor system may suitably be stationed on a member and its x and y coordinates may be monitored by reference to the output voltages obtained from sensors A and B respectively. Changes in the x and y coordinates (rotation and tilt) are evidenced by the unique changes in the output voltages observed. Through use of an analog to digital converter (as mentioned above in connection with FIG. 4), the analog signals representing the x and y coordinates are easily communicated to a processor for plotting, cursor positions, image location, and virtually any other application that requires knowledge of the rotational and tilt coordinates of a member.

Figure 9:
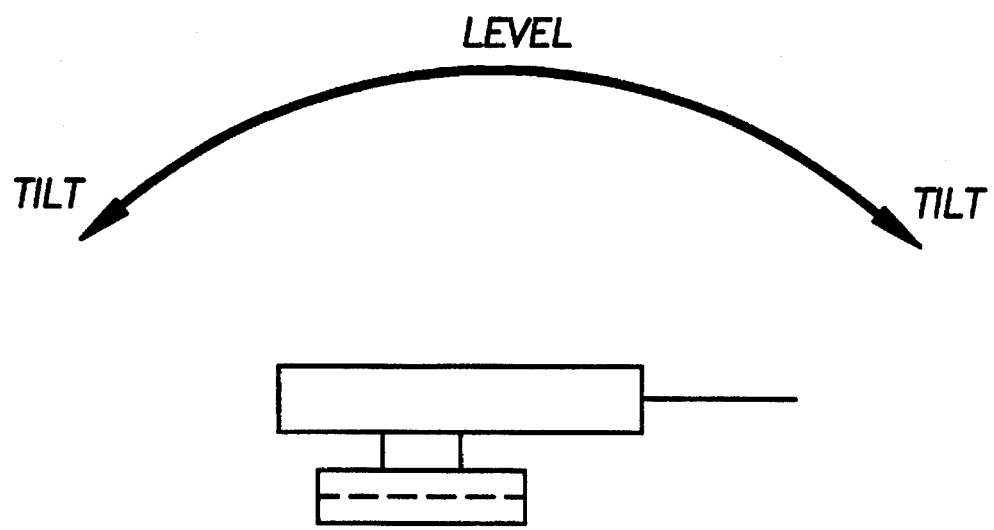
FIG. 9 is rear elevational view of the sensor of FIG. 1 shown rotating about its axis for determining yaw or side-to-side tilt.

As mentioned above, the sensor system of the present invention may be easily adapted to measure the z component or the yaw of the sensor system out of the plane parallel to the horizontal component of the Earth's magnetic field. FIG. 9 demonstrates the sensor system of the present invention as it is rolled from side-to-side in its optional mode to determine the z component of its position in relation to the Earth's magnetic field. As was mentioned previously, and referring back to FIG. 4, if gain 2 of operational amplifier circuit 25 is adjusted down to be equal to gain 1 of operational amplifier circuit 26, sensor A performs extremely efficiently in measuring yaw (or the z component). However, this excludes the measurement of the x component or compass heading.

It will be understood that in a preferred embodiment of the roll/tilt sensor system (as opposed to the tilt/yaw sensor system just discussed), the z component, if any, is inherent to the signal derived from sensor A because of the sensor's geometric configuration in relation to the two components of the Earth's magnetic field. Thus, when sensor A is moved in the x component from angle $\theta_1$ to $\theta_2$ and the sensor system rotates about its axis to yaw to either side, sensor A will produce an output voltage that is affected by both the change in position in the x component and in the z component. The variation is, however, extremely minor. Moreover, it is possible to actually determine the z differential from the signal produced through further processing of the signal.

Figure 10:
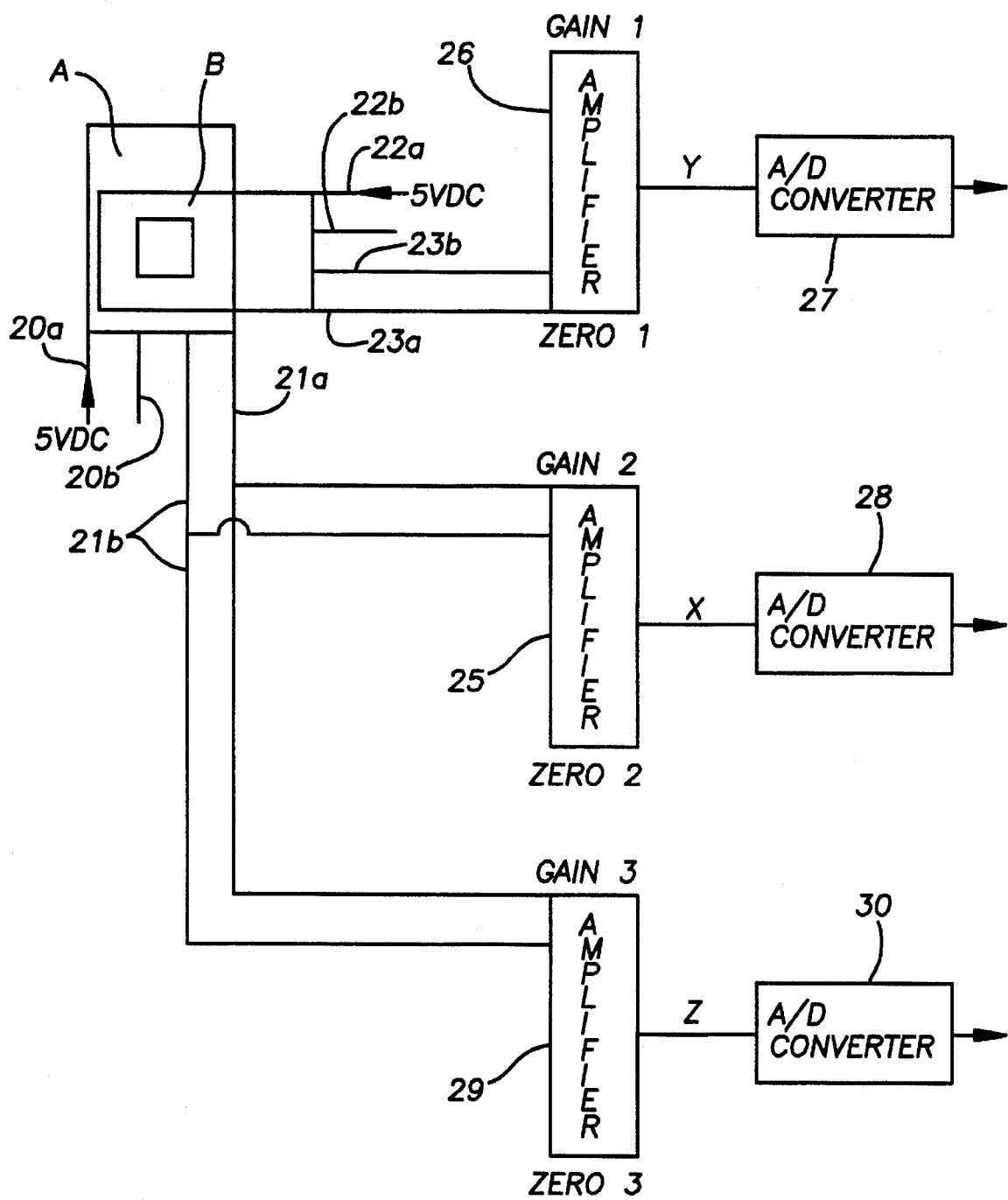
FIG. 10 is a block diagram of a preferred embodiment of the present invention for measuring in three axes.

However, referring now to FIG. 10, we have discovered that it is far less complex to split the output voltage from sensor A into two reference outputs, the first being communicated to operational amplifier circuit 25 and the second being communicated to operational amplifier circuit 29. In a preferred embodiment, the amplification gain in operational amplifier circuits 25 and 26 are similar to the gains discussed in connection with FIG. 4, where operational amplifier circuit 25 is given a higher gain than operational amplifier circuit 26. Also, in such embodiment, the amplification gain for the operational amplifier circuit 29 is the same as the amplification gain provided for operational amplifier circuit 26. The appropriate gains may be calculated and provided as discussed in connection with FIG. 4. Through providing a low gain on operational amplifier circuit 29, the signal strength through the circuit is insufficient to provide the change in resistance due to the horizontal component as indicated by the change in output voltage from sensor A and only the effects of the change in z are observed. The amplified signal from operational amplifier circuit 29 in a preferred embodiment is communicated to an analog to digital converter 30, for use as discussed in connection with FIG. 4. However, the operational amplifier circuit 25 with its higher gain also gives the change due to the horizontal component. Accordingly, the output from operational amplifier circuit 26 provides the y component, the output from operational amplifier circuit 25 provides the x component, and the output from the operational amplifier circuit 29 provides the z component. Consequently, in this embodiment of the present invention, the sensor system provides for a simple determination of angular position in three axes.

II. Applications Of the Sensor Systems Of the Invention

The sensor systems of the present invention are exceptionally useful in a wide array of industrial uses. For example, applications one presently known in the medical arts, computer arts, video game and other entertainment arenas, as well as transportation and other industrial applications.

More particularly, in the medical arts, the sensor systems of the present invention provide a unique method for undertaking studies in the ranges of motions of patients, for use in diagnostic, research, and rehabilitation. In such applications, the sensor systems of the present invention can be suitably attached to a point of interest on a patient and any combinations of x, y, and z motions of the point on the patient may be studied. Particularly interesting is the use of the sensor systems of present invention in gait analysis and in physical therapy for highly accurate monitoring and recording of ranges of motion.

In the transportation industries and other industrial applications, it will be understood that since the sensor systems of the present invention are not affected by acceleration or other inertial forces, they are highly useful for acceleration and braking analyses in the transportation industry. Each of the x, y, and z components are useful in understanding whether the vehicle skitters, veers, or tilts and in identifying the magnitude of those components for design and failure analyses. Moreover, in robotics and computer simulators (such as flight simulators), the sensor systems of the present invention are highly useful for determining points in space of arms or the unit.

Of particular importance to many of the applications of the present invention is the ability to interface the sensor systems of the present invention with a processor to allow man/machine interactions or man/computer interactions. In such situations it will be understood that the interactions may be direct or indirect. Direct interactions, as used herein, refer to situations in which an electromagnetic flux is controlled by a user and the sensor systems of the present invention are out of the control of the user and responsive to the flux. Whereas indirect interactions, as used herein, refer to situations in which the sensor systems of the present invention are controlled by a user and are responsive to an electromagnetic flux not in the users control.

Figure 11:
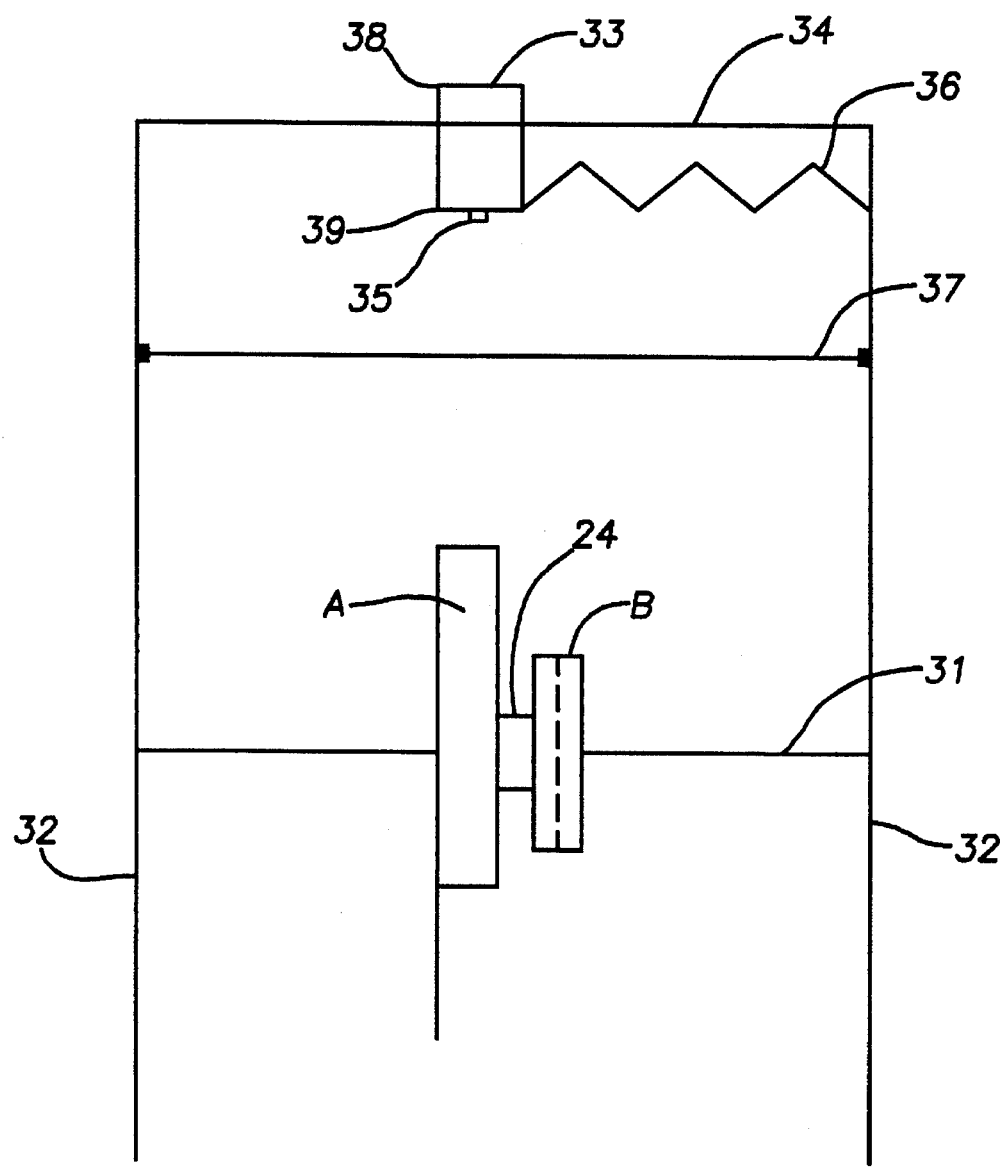
FIG. 11 is a schematic diagram of a single finger tracking system in accordance with the present invention for use as a joystick or mouse in human/machine interactive applications.

Referring now to FIG. 11, there is provided an example of a direct control system, wherein a user controls an electromagnetic flux and the sensor system of the present invention is stationary and out of the users control. In FIG. 11, there is provided a schematic diagram of a single finger tracking system in accordance with the present invention for use as a joystick or mouse in human/machine interactive applications.

It will be seen that the sensor system of the present invention comprising sensors A and B with magnet 24 deployed therebetween is secured with a mounting 31 within a supporting structure 32. A magnet 33 is deployed generally above the sensor system on a rack 34. The rack 34 can be a flexible membrane or a slidable surface, so that the magnet 33 can be moved in a forward and backward and side-to-side relation, thus providing variable x and y components to sensors A and B. As will be understood, as the magnet 33 is moved into the page or out of the page, a compass like reading will be output by sensor A, whereas, as the magnet 33 is moved side-to-side, a tilt reading will be output by sensor B.

In a preferred embodiment, the magnet 33 has an electrical contact 35 on its distal end that is grounded within the supporting structure 32 with an extendable wire 36. A charged plate 37 is preferably insulatingly supported within the supporting structure 32 below the magnet 33. Further, means are provided for distending the electrical contact 35 to connect with the charged plate 37. For example, where the rack 34 is a flexible membrane, the membrane may suitably contain sufficient flexion to allow the electrical contact 35 to be depressed to permit contact with the charged plate 37. Or, if the mounting 31 is a slidable surface, the magnet may be suitably provided with a spring or a spring-like mechanism, between an upper edge 38 (including a lower edge 39) of the magnet 33 and the mounting 31 to allow depression to contact and decompression to disconnect.

The connection that can be established between the electrical contact 35 and the charged plate 37 can be used for generating typical "mouse" button actions, as will be understood by one of skill in the art. Consequently, the system represented by FIG. 11 provides a unique alternative to the typical mouse or joystick commonly employed in man/computer or man/machine interactions. Amazingly, very high resolutions can be achieved with single finger operation. Moreover, the system may be fabricated to be self centering (i.e., returning to a chosen position after an operation has been accomplished) when a flexible membrane is used to prepare the mounting 31 or where spring-like mechanisms return the magnet 33 on a slidable rack to a position.

The system may be easily adapted for use in the operation of machinery, such as electric wheel chairs, and the like. Moreover, the system offers the user very smooth turning in both forward and reverse directions. And, fundamentally, since virtually the entire system is electronic, with only one or two moving parts (the mounting 31 and the optional depression feature, in contrast to joysticks and mice), longer life is expected. Still further, units may be fabricated in exceptionally small sizes, such that one may prepare a smaller and more accurate replacement for the track ball systems now common in laptop computers. It is likely possible to incorporate the single finger tracking system of the present invention in palm top computers.

Through tying the single finger tracking system of the present invention with the circuit discussed in connection with FIG. 4, a digital signal corresponding to x and y coordinates is obtained. As will be understood, such signals may be supplied to a computer, an instrument, a piece of machinery, or the like and controlled with software that is readily adapted from software well known in the art to interface with, and obtain control over, functions such as cursor control, vehicle control, and the like. Conventional circuit boards may be readily adapted to allow these interactions.

In indirect interactions, the sensor systems of the present invention also present fundamental improvements over the art. A principal feature of the invention is its adaptation to tracking motions of a portion of the human anatomy, such as finger or hand tracking or head tracking units. In such applications, it will be readily understood that the sensor system of the present invention may be simply attached to the region of interest, for example to glasses, the finger tips, the back of a hand, or a mask. Leads may be run into a circuit board containing the circuits discussed in connection with FIGS. 4 and 10, depending on whether two- or three-axes are desired, and digital signals will be obtained that correspond to x and y, y and z, or x, y, and z coordinates. As will be understood, such signals may be supplied to a computer, an instrument, a piece of machinery, or the like and controlled with software that is readily adapted from software well known in the art to interface with, and obtain control over, functions such as cursor control, vehicle control, and the like. Conventional circuit boards may be readily adapted to allow these interactions.

Moreover, it is well known that a variety of manufacturers are developing special masks or display techniques that, through interfacing with a computer or other processing system will change a view according to a users head position. These systems are commonly referred to as virtual reality systems. Alternatively, certain manufacturers have developed simulator systems that similarly will provide views based on a users head position. The sensor systems of the present invention provide a new paradigm to the real time provision of the data necessary to allow such simulated or virtual reality.

The present invention has been described in terms of certain preferred embodiments and represents the best mode contemplated. However, it will be understood that the scope of the present invention is to be interpreted according to the appended Claims and any equivalents.

What we claim is;

1. A sensor system for measurement of angular position in at least two axes, comprising:

a first magnetoresistive sensor located in a first plane;

a second magnetoresistive sensor located in a second plane, wherein said first and second planes are parallel, and wherein said first sensor is separated from said second sensor by a biasing magnetic field, said biasing magnetic field being generated by a permanent magnet, and said first and second sensors being orthogonal to one another and each of said sensors being adapted to vary in resistance in accordance with the angular position of said sensors in an external magnetic field, the external magnetic field having a horizontal component and a vertical component;

an input terminal on each of said first and second sensors for applying a voltage thereto;

an output terminal connected to each of said first and second sensors;

a first amplifier circuit of a first gain connected to the output terminal of the first sensor so as to receive an output voltage from said output terminal of said first sensor and to produce a first amplified voltage in response thereto; and a second amplifier circuit of a second gain connected to the output terminal of the second sensor so as to receive an output voltage from said output terminal of said second sensor and to produce a second amplified voltage in response thereto, wherein the first gain is sufficiently high to ensure that the first amplified voltage from the first amplifier circuit varies according to a magnetic flux of the horizontal component of the magnetic field and the second gain is sufficiently low such that the second amplified voltage from the first amplifier varies according to a magnetic flux of the vertical component of the magnetic field and wherein said first and second amplified voltages define a measurement of an angular position of the first and second sensors in relation to the external magnetic field.

2. The sensor system of claim 1, further comprising:

a first analog to digital converter connected to said first amplifier circuit so as to receive said first amplified voltage therefrom and produce a digital signal representation of said first amplified voltage; and a second analog to digital converter connected to said second amplifier circuit so as to receive said second amplified voltage therefrom and produce a digital signal representation of said second amplified voltage.

3. A sensor system as defined in claim 1 or claim 2 wherein the first amplified voltage is representative of an amount of roll experienced by the sensor system with respect to an initial sensor position, and wherein the second amplified voltage is representative of an amount of tilt experienced by the sensor system with respect to an initial sensor position.

4. A sensor system as defined in claim 1 or claim 2 wherein the first amplified voltage is representative of an amount of yaw experienced by the sensor system with respect to an initial sensor position, and wherein the second amplified voltage is representative of an amount of tilt experienced by the sensor system with respect to an initial sensor position.

5. A method for measuring angular displacement or position of a member in two axes by use of a first magnetoresistive sensor located in a first plane and a second magnetoresistive sensor located in a second plane, said first and second planes being parallel, said first and second sensors being separated from one another by a biasing magnetic field, the biasing magnetic field being generated by a permanent magnet, and the first and second sensors being orthogonal to one another and each of the sensors being adapted to vary in resistance in accordance with the angular position of the sensors in an external magnetic field, the sensors having respective input terminals for applying a voltage thereto and respective output terminals, the method comprising the steps of:

attaching the sensors to the member in an orientation such that the plane defined by said sensors is generally aligned parallel to a horizontal component of the external magnetic field;

supplying a voltage to each of said sensors such that an output voltage is produced by each of said sensors;

amplifying the output voltage from the first sensor with a first gain to produce a first amplified output voltage, wherein the first gain is sufficiently high to ensure that the first amplified voltage from the first amplifier varies according to a magnetic flux of the horizontal component of the magnetic field;

amplifying the output voltage from the second sensor with a second gain to produce a second amplified output voltage, the second gain is sufficiently low such that the second amplified voltage from the second amplifier varies according to a magnetic flux of the vertical component of the magnetic field;

angularly displacing said member in at least one axis to cause a change in the output voltage from at least one of said sensors, wherein a change in one of said first and second amplified output voltages provides a measurement of a change in angular position of said member.

6. The method according to claim 5, further comprising the step of setting the first gain sufficiently high so that the output voltage from the first sensor corresponds to angular displacement of the first sensor relative to a horizontal component of the external magnetic field, such that monitoring and measuring is accomplished in an X and Y axis.

7. The method according to claim 5, further comprising the step of setting the first gain sufficiently low so that the output voltage from the first sensor corresponds to angular displacement of the first sensor relative to a vertical component of the external magnetic field, such that monitoring and measuring is accomplished in a Y and Z axis.

8. A sensor system for measuring angular position in Earth's magnetic field, comprising:

a first magnetoresistive sensor located in a first plane for providing a first signal representative of position of the first sensor with reference to a first axis in the Earth's magnetic field;

a second magnetoresistive sensor located in a second plane, the first and second planes being parallel, and the second sensor being oriented orthogonally with respect to said first sensor and said first and second sensors being separated by a biasing magnetic field, said biasing magnetic field being generated by a permanent magnet, for providing a second signal representative of position of the second sensor with reference to a second axis in the Earth's magnetic field;

the first and second sensor being in communication with respective first and second amplifier circuits to produce respective first and second amplified signals for indicating the angular position of the sensors with respect to said first and second axes, wherein the first amplifier circuit produces a gain that is sufficiently high to ensure that the amplified signal from the first amplifier varies according to a magnetic flux of the horizontal component of the magnetic field and the second amplifier circuit produces a gain that is sufficiently low such that the amplified signal from the first amplifier varies according to a magnetic flux of the vertical component of the magnetic field.

9. A sensor system for measurement of angular position in two axes, comprising:

a first magnetoresistive sensor located in a first plane;

a second magnetoresistive sensor located in a second plane, wherein said first and second planes are parallel, and wherein said first sensor is separated from said second sensor by a biasing magnetic field, said biasing magnetic field being generated by a permanent magnet, and said first and second sensors being orthogonal to one another and each of said sensors being adapted to vary in resistance in accordance with the angular position of said sensors in relation to Earth's magnetic field having a horizontal component and a vertical component;

an input terminal on each of said first and second sensors for applying a voltage thereto;

an output terminal connected to each of said first and second sensors;

a first amplifier circuit of a first gain connected to the output terminal of the first sensor so as to receive an output voltage from said output terminal of said first sensor and to produce a first amplified voltage in response thereto; and a second amplifier circuit of a second gain connected to the output terminal of the second sensor so as to receive an output voltage from said output terminal of said second sensor and to produce a second amplified voltage in response thereto, wherein the gain on the first amplifier circuit is selected to render the first sensor sensitive to variations in the horizontal component and the gain on the second amplifier circuit is selected to render the second sensor sensitive to variations in the vertical component and wherein said first and second amplified voltages define a measurement of an angular position of the first and second sensors in relation to the external magnetic field.

10. A method for measuring angular displacement or position of a member in two axes, comprising:

providing a first magnetoresistive sensor located in a first plane and a second magnetoresistive sensor located in a second plane, wherein said first and second planes are parallel and said first and second sensors are separated from one another by a biasing magnetic field, the biasing magnetic field being generated by a permanent magnet, the first and second sensors being orthogonal to one another and each of the sensors being adapted to vary in resistance in accordance with the angular position of the sensors in relation to Earth's magnetic field having a horizontal component and a vertical component, the sensors having respective input terminals for applying a voltage thereto and respective output terminals;

attaching the sensors to the member in an orientation such that the plane defined by said sensors is generally aligned parallel to a horizontal component of the external magnetic field;

supplying a voltage to each of said sensors such that an output voltage is produced by each of said sensors;

amplifying the output voltage from the first sensor with a first gain to produce a first amplified output voltage, wherein the first gain is selected to render the first sensor sensitive to the horizontal component;

amplifying the output voltage from the second sensor with a second gain to produce a second amplified output voltage, wherein the second gain is selected to render the second sensor sensitive to the vertical component;

angularly displacing said member in at least one axis to cause a change in the output voltage from at least one of said sensors, wherein a change in one of said first and second amplified output voltages provides a measurement of a change in angular position of said member.

* * * * *